United States Patent [19]

Affrossman et al.

[11] Patent Number: 4,885,344

[45] Date of Patent: Dec. 5, 1989

[54] POLYMERIC MATERIALS AND THEIR USE AS RESISTS

[75] Inventors: Stanley Affrossman, Bearsden; Massoud Bakhshaee, Glasgow; Richard A. Pethrick, Newlands; David C. Sherrington, Lenzie, all of Scotland

[73] Assignee: National Research Development Corporation, London, England

[21] Appl. No.: 145,238

[22] Filed: Jan. 19, 1988

[30] Foreign Application Priority Data

Jan. 19, 1987 [GB] United Kingdom ................ 8701021

[51] Int. Cl.$^4$ .................... C08F 265/04; C08F 267/06
[52] U.S. Cl. .................................... 525/302; 525/308; 430/910
[58] Field of Search ................ 430/910; 525/308, 302

[56] References Cited

U.S. PATENT DOCUMENTS 4,732,831  3/1988  Riesenfeld ............................. 430/49

Primary Examiner—J. David Welsh
Attorney, Agent, or Firm—Nixon & Vanderhye

[57] ABSTRACT

Polymeric materials useful as positive resists comprise a backbone formed from an addition polymer which is degradable by radiation and at least 3 pendant polymeric groups which show no appreciable positive resist characteristics. Preferably these materials comprise a backbone which is a polymethacrylate ester and from 3 to 5 pendant polystyrene groups. These polymers exhibit increased sensitivity and resistance to plasma processing and provide resists which are useful as components of integrated circuits.

19 Claims, No Drawings

POLYMERIC MATERIALS AND THEIR USE AS RESISTS

This invention relates to polymeric materials; more particularly, this invention relates to polymeric materials which are sensitive to irradiation; to processes for preparing such polymeric materials and to their use as resists, especially as electron beam (EB) resists; and to integrated electronic circuitry wherein such resists have been utilised in its manufacture.

Positive resists comprise materials which can be degraded by irradiation and which are used in the manufacture of integrated electronic circuits or "chips" by a lithographic process. In the process a substrate, typically a semiconducting material or chrome mask, is spin coated with a solution of the degradable material which, on solvent evaporation, leaves a thin, uniform film of the material on the substrate. This resist is then irradiated with electron, X- or photo-radiation. Irradiation of the positive resist results in degradation of the irradiated parts and a consequent increase in their solubility. The irradiated material is then developed by solvent treatment to form the positive of the electronic circuit indicia.

Increasingly there is a need for chips in which more electronic circuitry is incorporated onto a given area of substrate. This requires lithographic processes capable of greater resolution. Resolution (which depends on $\lambda$ wherein $\lambda$ is the wavelength of the radiation with which the curable material is irradiated) may be enhanced by using short wavelength UV radiation (so called "deep" UV radiation); however, technology is already approaching the stage where further progress is limited by the wavelength of UV radiation. Electron beams have wavelengths less than 1 Å and are being increasingly used as a means for irradiating resists (EB resists).

Currently available resists are not, however, sufficiently sensitive to EB; and this results in radiation degrading the resist in a relatively indiscriminate manner resulting in poor resolution and in batch-to-batch variation. Currently available resists also have poor adhesion or resistance to plasma processing.

This invention seeks to provide positive resists which reduce the above-mentioned disadvantages.

According, therefore, to the present invention there is provided a film-forming, polymeric material, suitable for use as a positive resist, which comprises (a) a backbone, degradable by irradiation, comprising the residue of a homo- or co-polymer formed by the addition polymerisation of at least one olefinically unsaturated compound in which at least one of the olefinically unsaturated carbon atoms is not bonded to a hydrogen atom and/or at least one compound comprising a 3- or 4- membered carbocyclic or ring sulphur atom-containing heterocyclic compound in which at least one of the ring carbon atoms is not bonded to a hydrogen atom and (b), depending from (a) and differing therefrom, at least 3 homo- or co-polymeric pendant groups which may be the same or different and which, in service, show no appreciable positive or negative resist characteristics at the radiation dosage used.

Suitably, backbone (a) comprises the residue of a homo- or co-polymer formed by the addition polymerisation of at least one compound of the formula:

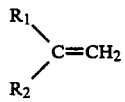

wherein:
$R_1$ represents an aromatic, desirably a carbocyclic aromatic, preferably a benzenoid aromatic, group or a carboxylic acid, carboxylic acid halide, suitably a carboxylic acid chloride, carboxylic acid amide, suitably a primary carboxylic acid amide, or a carboxylic acid ester group; and
$R_2$ represents a halogen atom or a substituted, desirably a halo-substituted, or unsubstituted alkyl group.

Preferably, $R_1$ represents a phenyl group or a carboxylic ester group of the formula:

wherein:
$R_3$ represents an unsubstituted or halo-, preferably fluoro-, substituted $C_1$ to $C_5$ alkyl group; for example, a methyl, trifluoromethyl, ethyl, pentafluoroethyl, isopropyl, tert.-butyl or neo-pentyl group.

Preferably, $R_2$ represents a chlorine or fluorine atom or a fluoro-substituted or unsubstituted alkyl group; for example, a trifluoromethyl or methyl group.

It is particularly preferred that (a) comprises a major amount of an unsubstituted $C_1$ to $C_4$ alkyl methacrylate; for example, methyl methacrylate or tert.-butyl methacrylate.

It is also within the scope of the present invention that the backbone of the polymeric material also comprises a minor amount, for example, less than 50%, preferably less than 20% by weight, of an analogous acrylate; that is, any of the compounds wherein $R_1$ represents $-COOR_3$ but wherein instead $R_2$ represents a hydrogen atom.

Suitably, the pendant groups (b) are constituted to provide enhanced plasma etch resistance, adhesion and contrast in service. Preferably, (b) comprises the residue of a silicon-containing homo or co-polymer, for example a siloxane, or the residue of a homo- or co-polymeric siloxane or the residue of a homo- or co-polymer formed by the addition polymerisation of at least one olefinicially unsaturated compound in which both of the olefinically unsaturated carbon atoms are bonded to hydrogen atoms. Suitably the compound is an aromatic, desirably a carbocyclic aromatic, preferably a benzenoid aromatic, olefinically unsaturated such compound. It is particularly preferred that the olefinically unsaturated compound is a (substituted or unsubstituted phenyl) vinyl compound, especially styrene.

It is preferred that there are at least 3 and no more than 7 such pendant groups (b) depending from the backbone (a). Preferably there are 3 or 4 such pendant groups (b). Polymeric materials with more than 5 such groups have a tendency to crosslink on irradiation and may thereby act as negative, rather than positive, resists). It is also found that the ratio of the number of monomer units comprising the backbone to the number of pendant groups is of importance: typically this ratio should be from 25:1 to 100:1, preferably from 33:1 to 50:1. It is further found that the average molecular weight of the pendant groups (b) may be as low as that derived from two monomer units or up to a value less than a molecular weight, $M_c$, for a given polymer material above which molecular entanglements occur.

The precise value of $M_c$ depends on the composition of the polymer material. Some values for polymer materials used in resist formulation are as follows:

|  | $M_c$ |
| --- | --- |
| polymethylmethacrylate | 16,000 |
| polystyrene | 18,000 |
| poly (α-methylstyrene) | 14,000 |
| poly (vinylacetate) | 12,000 |
| polyisobutylene | 9,000 |
| poly(dimethylsiloxane) | 8,000 |

However, these values are derived from free polymers rather than, as is the case in the present invention, polymeric residues depending from a backbone: this structure will necessarily restrict the number of conformations the depending polymeric residues may assume and, accordingly, reduce the possibilities for entanglement. This, in turn, will tend to increase the apparent value for Mc. In general, the average molecular weight of the pendant groups (b) is suitably above 300 and below 25,000; typically, from 4,000 to 10,000. Because the behaviour of these polymeric materials as EB resists varies even within these preferred ranges particular materials may be less effective or even exhibit negative resist behaviour. The behaviour of such materials may be altered by adjusting one or more of the above parameters and the optimum values, e.g. a particular backbone may be determined by routine experimentation.

It is particularly preferred that the backbone (a) comprises a homo or copolymer formed by the addition polymerisation of a β-alkyl acrylate ester and the residue (b) comprises a styrene, desirably wherein (b) is derived from a β-alkyl acrylate ester terminated polystyrene, especially wherein the backbone (a) comprises a $C_1$ to $C_4$ alkyl methacrylate ester and the residue (b) comprises a styrene residue.

It is preferred, in order to secure enhanced plasma etch resistance, that the polymeric material comprises at least 15% by weight of polymerised styrene.

It is desirable, in order to enhance the adhesion of the polymeric material of this invention to a substrate, to terminate the pendant group with an appropriate functional group. The nature of such groups will depend on the surface constitution of the substrate. The film-forming, polymeric materials of the invention are "comb" polymers; they may be prepared by analogy with known processes.

This invention further provides a positive resist-bearing substrate whenever prepared from a polymeric material as herein described.

The positive resist-bearing substrate is prepared in known manner; for example, by preparing a solution, typically from 1 to 10 w/v%, such as 2 to 5 w/v%, of the polymeric material in a, preferably volatile, solvent; and applying the solution to the substrate, typically a freshly cleaned silicon "wafer", which is maintained spinning, for example at 2,000 to 3,000 rpm until the solvent has evaporated, typically for about 2 minutes whereafter a film of thickness from 2,000 to 3,000 Å is obtained. The resist bearing substrate is then baked both to remove residual solvent and to permit flow, typically at a temperature above the Tg of the polymeric material typically at a temperature of from 140° to 160° C. for about 1 h.

The positive resist-bearing substrate is developed in known manner; for example, by irradiating the substrate, prepared as mentioned above, with a beam of electrons, typically at a dose from 10 to 10,00 $\mu C\ cm^{-2}$. The irradiated resist is then developed by treatment with an appropriate solvent and the developed resist bearing substrate is etched.

The developer solvent is a mixture of solvent and non-solvent in which the pendant groups (b), liberated from the backbone (a) by the irradiation are essentially insoluble but in which the backbone residues are soluble. In the case of methyl methacrylate/styrene systems a mixture of cyclohexane with from 10 to 15%, by volume of toluene or methyl ethyl ketone is preferably used; in the case of tert.-butyl methacrylate/styrene systems the same mixture or the homologue, methylcyclohexane is preferably used.

The invention also provides an integrated electronic circuit prepared from the positive resist-bearing substrate of the invention.

The following Examples illustrate the invention.

EXAMPLE 1

This Example illustrates the preparation of a styrene-methylmethacrylate comb polymer in accordance with the invention.

5 g of a methylmethacrylate terminated-polystyrene of $M_n$ about 10,000 (ex Polysciences-Company) were dissolved in 30 ml of sodium-dried toluene (ANALAR ex May and Baker) and 0.04 to 0.08 g of of AIBN (ex Aldrich Chemicals), as initiator, was then added together with 1.7 2.5 or 5 ml of methylmethacrylate (ex BDH) (Polymers 1.1, 1.2 and 1.3 respectively), the quantity depending on the particular polymer being prepared. The mixture was then charged into a dilatometer; outgassed; and sealed. The sealed tube was then placed in a thermostat bath at 80° C. for 2 to 3 hours to allow the mixture to react. Finally, the polymer was precipitated using methyl alcohol.

The unreacted methylmethacrylate terminated-polystyrene was removed by extraction into cyclohexane (at 35° to 45° C.) 7 to 8 times.

Resist parameters of the products of Example 1 are shown in Table 1 below:

TABLE 1

| EX-AMPLE | $M_n$ | DEVEL-OPING SOLVENT[1] | EXPO-SURE TIME (min.) | SENSI-TIVITY ($\mu C.cm^{-2}$) | CON-TRAST |
| --- | --- | --- | --- | --- | --- |
| 1.1 | 44,000 | 20% v T/CH | 2 | 460 | 2.9 |
| 1.2 | 52,000 | 20% v T/CH | 2 | 960 | 0.8 |
| 1.3 | 60,000 | 20% v T/CH | 2 | 880 | 1.08 |

[1]T = toluene; CH = cyclohexane

EXAMPLE 2

This Example illustrates the superior reactive ion etch (RIE) resistance of the Polymers 1.1 and 1.3 produced in the preceding Example compared to a polymethylmethacrylate $M_n$ 80,000 and an acrylate terminated polystyrene $M_n$ 7000.

Films, typically between 1500 and 2000 Å (or, in the case of polymethylmethacrylate, between 3000 and 4000 Å) in thickness were spun, in a manner known per se, from an evaporating solution onto glass microscope slides and baked, just above their glass transition temperatures, for several hours. The resist coated slides were then, in turn, placed on a silicon coated electrode forming the bottom electrode of a reactive ion etcher. A cover slip was then placed across a portion of the resist coated slide to provide an edge for the purposes of exposure. The height of this edge and the thickness of the resist coating were then measured using a "DEK-TAK" surface profile analyser.

Films were exposed to a $CHF_3$ Ar RIE plasma (which is used for etching $SiO_2$ at a rate of 250 Å $min^{-1}$) both for fixed exposure times and also for exposure times which varied over the surface of the resist coating. Results are shown in Table 2.

TABLE 2

| RESIST COATING | ETCHING RATE (Å $min^{-1}$) |
|---|---|
| polymethylmethacrylate | 1450 |
| Product 1.1 | 400 |
| Product 1.3 | 650 |
| polystyrene | 500 |

EXAMPLE 3

Films were similarly exposed to a $NF_3$ plasma (which is used for etching Si in $SiN_x$); the results are shown in Table 3.

TABLE 3

| RESIST COATING | ETCHING RATE (Å $min^{-1}$) |
|---|---|
| polymethylmethacrylate | 2200 |
| Product 1.1 | 900 |
| polystyrene | 2000 |

These results show that the introduction of styryl groups into the polymer can enhance the plasma etch resistance of methacrylate positive resists without impairing their sensitivity or contrast.

EXAMPLE 4

The preparative procedure of Example 1 was used to prepare a series of two polymers based upon tertiary butyl methacrylate (ex BDH) and the same methylmethacrylate terminated polystyrene as was used in Example 1. The plasma etch rate of each product was determined using the procedures of Examples 2 and 3 and the sensitivity and contrast of the products were determined.

The results are shown in the following Table 3.

TABLE 3

| Amount of Macromer | Amount of Butyl Methacrylate | Molecular Weight of Product | Sensitivity $C/cm^2$ | Contrast | Plasma Etch Rate | | | |
|---|---|---|---|---|---|---|---|---|
| | | | | | $CHF_3/Ar$ | $NF_3$ | $SiCl_4$ | $O_2/Cl_2$ | $NF_3:HCl$ |
| 1 5 g (Mn~$10^4$) | ~5 ml | 77,000 | 31 | 2.0 | 650 | 1150 | 65 | 95 | 230 |
| 2 5 g (Mn~$10^4$) | ~4 ml | 66,000 | Negative Image | — | | | | | |

EXAMPLE 5

The preparative procedure of Example 1 was used to prepare a series of three polymers based upon tertiary butyl methacrylate (ex BDH) and a methylmethacrylate terminated polystyrene of Mn of 4000 (ex Polysciences). The polymers were tested in the same manner as is set out in Example 4. The results are presented as Table 5.

TABLE 5

| | Amount of Macromer | Amount of Tertiary Butyl Methacrylate | Molecular Weight of Product | Sensitivity $\mu C/cm^2$ | Contrast |
|---|---|---|---|---|---|
| 1. | 5 g (Mn~$10^4$) | ~5 ml | 60,000 | 63 | 1.5 |
| 2. | 5 g (Mn~$10^4$) | ~2.0 ml | 27,000 | Negative Image | — |
| 3. | 5 g (Mn~$10^4$) | ~2.8 ml | 37,000 | 50 | 1.4 |

We claim:

1. A film-forming polymeric material, suitable for use as a positive resist, which comprises (a) a backbone, degradable by irradiation, comprising the residue of a homo- or co-polymer formed by the addition polymerisation of at least one olefinically unsaturated compound in which at least one of the olefinically unsaturated carbon atoms is not bonded to a hydrogen atom and/or at least one compound comprising a 3- or 4- membered carbocyclic or a ring sulphur atom-containing heterocyclic compound in which at least one of the ring carbon atoms is not bonded to a hydrogen atom and (b), depending from (a) and differing therefrom, at least 3 homo- or co-polymeric pendant groups which may be the same or different and which, in service, show no appreciable positive or negative resist characteristics at the radiation dosage used.

2. A polymeric material according to claim 1 wherein (a) comprises the residue of a homo- or co-polymer formed by the addition polymerisation of at least one compound of the formula:

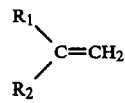

wherein:
$R_1$ represents an aromatic group or a carboxylic acid, carboxylic acid halide, carboxylic acid amide, or carboxylic ester group; and
$R_2$ represents a halogen atom or a substituted or unsubstituted alkyl group.

3. A polymeric material according to claim 2 wherein $R_1$ represents a phenyl group.

4. A polymeric material according to claims 2 or 3 wherein $R_1$ represents a carboxylic ester group of the formula:

wherein:
$R_3$ represents an unsubstituted or halo-substituted $C_1$ to $C_5$ alkyl group.

5. A polymeric material according to claim 4 wherein $R_3$ represents an unsubstituted methyl, ethyl, iso-propyl or tert.-butyl group.

6. A polymeric material according to any of claims 2 to 5 wherein $R_2$ represents a chlorine or fluorine atom, a tri-fluoromethyl group or a methyl group.

7. A polymeric material according to any preceding claim wherein the backbone of the polymeric material also comprises a minor amount of an analogous acrylate.

8. A polymeric material according to any preceding claim wherein (b) comprises the residue of a silicon-containing homo- or copolymer or the residue of a homo- or co-polymer formed by the addition polymerisation of at least one olefinically unsaturated compound in which both of the olefinically unsaturated carbon atoms are bonded to hydrogen atoms.

9. A polymeric material according to claim 8 wherein the olefinically unsaturated compound is a (substituted or unsubstituted phenyl) vinyl compound.

10. A polymeric material according to claim 9 wherein the olefinically unsaturated compound is styrene.

11. A polymeric material according to any of the preceding claims wherein the polymer comprises no more than 7 pendant groups.

12. A polymeric material according to claim 11 wherein the polymer comprises from 3 to 5 pendant groups.

13. A polymeric material according to claim 12 wherein the polymer comprises 3 or 4 pendant groups.

14. A polymeric material according to any preceding claim wherein the ratio of the number of monomer units comprising the backbone: number of pendant groups is from 25:1 to 100:1.

15. A polymeric material according to claim 14 wherein the ratio is from 33:1 to 50:1.

16. A polymeric material according to any preceding claim wherein the average molecular weight of the pendant groups (b) is from above 300 to 25,000.

17. A polymeric material according to any preceding claim wherein the backbone (a) comprises a $\beta$-alkyl acrylate ester and the residue (b) comprises a styrene.

18. A polymeric material according to claim 17 wherein (b) is derived from a $\beta$-alkyl acrylate ester-terminated polystyrene.

19. A polymeric material according to either of claims 14 or 15 wherein the backbone (a) comprises a $C_1$ to $C_4$ alkyl methacrylate ester and the residue (b) comprises a styrene residue.

* * * * *